United States Patent
Wu et al.

(10) Patent No.: US 7,054,343 B1
(45) Date of Patent: May 30, 2006

(54) METHOD OF COMPENSATING FOR TEMPERATURE CHANGES AND CHANNEL VARIATIONS IN A LASER DIODE ARRAY TO PRODUCE A SUBSTANTIALLY CONSTANT AVERAGE OPTICAL POWER OVER TEMPERATURE

(75) Inventors: Hsin-Ho Wu, Santa Clara, CA (US); Peter Deane, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 405 days.

(21) Appl. No.: 10/304,356

(22) Filed: Nov. 26, 2002

(51) Int. Cl.
*H01S 3/04* (2006.01)
(52) U.S. Cl. .................. 372/34; 372/33; 372/38.02; 372/32
(58) Field of Classification Search ........... 372/29.014, 372/20, 29.011, 34, 33, 38.02
See application file for complete search history.

(56) References Cited

U.S. PATENT DOCUMENTS

| | | | |
|---|---|---|---|
| 4,903,273 A | 2/1990 | Bathe | 372/38 |
| 5,019,769 A | 5/1991 | Levinson | 372/31 |
| 5,200,967 A * | 4/1993 | Miyata et al. | 372/32 |
| 6,055,252 A * | 4/2000 | Zhang | 372/34 |
| 6,362,910 B1 | 3/2002 | Tokita | 359/180 |
| 2003/0169790 A1* | 9/2003 | Chieng et al. | 372/34 |

* cited by examiner

*Primary Examiner*—Minsun Oh Harvey
*Assistant Examiner*—Dung T. Nguyen
(74) *Attorney, Agent, or Firm*—Mark C. Pickering

(57) ABSTRACT

A relatively constant average optical power is provided over a user-defined range of temperatures by detecting the temperature, and adjusting the bias currents input to the laser diodes in an array of laser diodes based on the temperature and the channel loss of the channel connected to each diode.

18 Claims, 12 Drawing Sheets

METHOD OF COMPENSATING FOR TEMPERATURE CHANGES AND CHANNEL VARIATIONS IN A LASER DIODE ARRAY TO PRODUCE A SUBSTANTIALLY CONSTANT AVERAGE OPTICAL POWER OVER TEMPERATURE

DETAILED DESCRIPTION OF THE INVENTION

Figure 1:
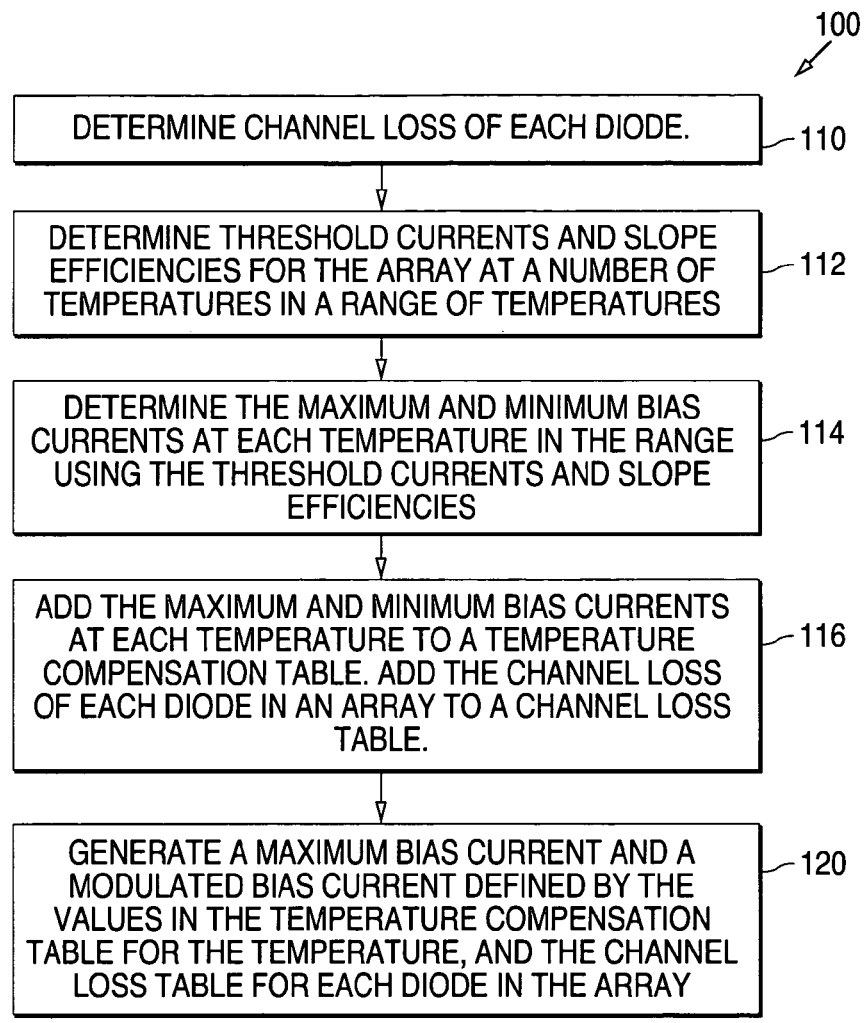
FIG. 1 is flow chart illustrating an example of a method 100 of compensating an array of laser diodes for changes in temperature and channel conditions in accordance with the present invention.

FIG. 1 shows a flow chart that illustrates an example of a method 100 of compensating an array of laser diodes for changes in temperature and channel conditions in accordance with the present invention. As described in greater detail below, the present method provides a relatively constant average optical power over a user-defined range of temperatures by detecting the temperature, and adjusting the bias currents input to the laser diodes based on the temperature and the channel loss of the channel.

As shown in FIG. 1, method 100 includes step 110 where a channel loss factor is determined for each of the laser diodes in an array of diodes. The channel loss factor is a factor that is used to compensate for misalignment and other mechanical errors between a diode and the fiber or channel that is connected to the diode.

After a channel loss factor has been determined for each diode in the array, one of the diodes is selected to be a base diode with a base optical power. For example, the laser diode in the array with the best threshold current ITH or slope efficiency SE can be selected to be the base laser diode with the base optical power and base channel loss.

The other laser diodes are then assigned a channel loss that is relative to the base optical power and the base channel loss. For example, if the base diode has a base average optical power of x and a second diode has an average optical power of 0.8x, then the second diode is assigned a channel loss of 0.2. The channel loss changes the average optical power output by a laser diode so that all of the laser diodes in the array have similar average optical powers regardless of misalignment or other mechanical errors.

In addition to determining a channel loss for each of the laser diodes in an array, method 100 also includes step 112. In step 112, method 100 determines the threshold currents $I_{TH}$ and slope efficiencies SE of a selected laser diode array for a number of temperatures in a range of temperatures.

Figure 2:
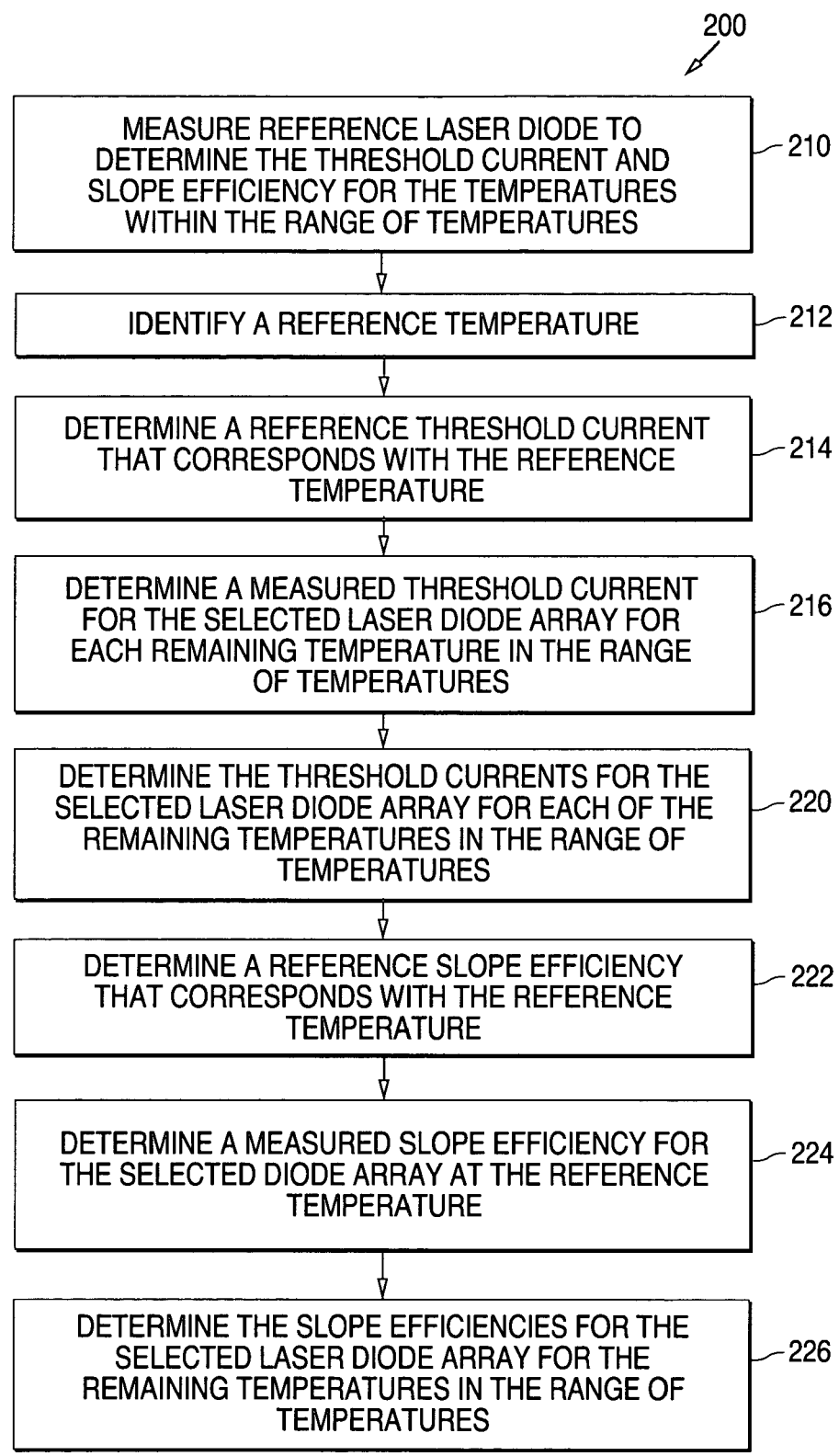
FIG. 2 is a flow chart illustrating a method 200 of determining the threshold currents $I_{TH}$ and slope efficiencies SE of the diodes in a laser diode array at each temperature in the range of temperatures in accordance with the present invention.

FIG. 2 shows a flow chart that illustrates a method 200 of determining the threshold currents $I_{TH}$ and slope efficiencies SE of a selected laser diode array at each temperature in the range of temperatures in accordance with the present invention. As shown in FIG. 2, method 200 begins at step 210 by measuring a reference laser diode to determine threshold currents $I_{TH}$ and slope efficiencies SE for the temperatures within the range of temperatures.

Figure 3:
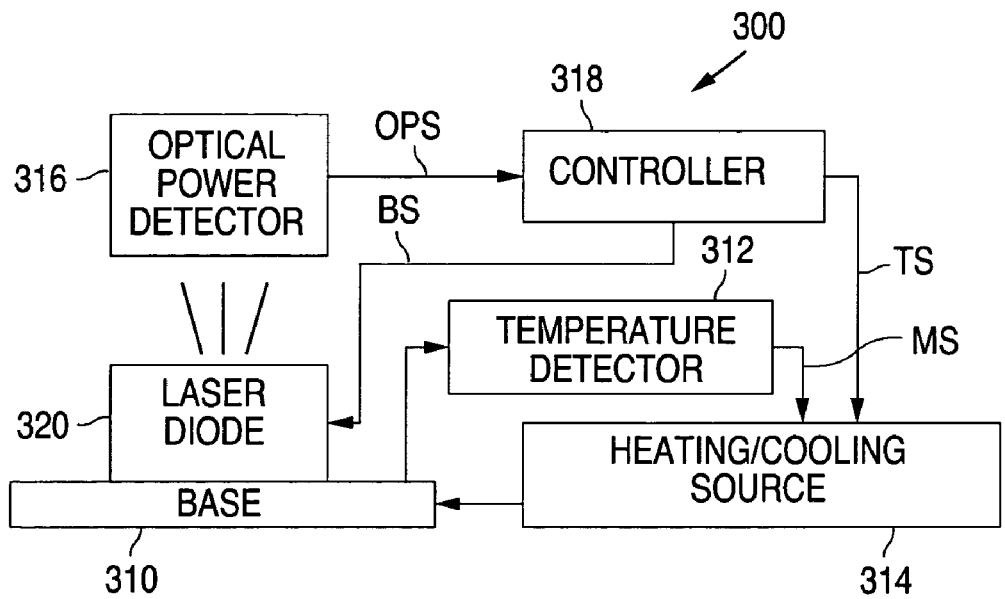
FIG. 3 is a block diagram illustrating an example of a test set up 300 that measures threshold currents $I_{TH}$ and slope efficiencies SE of the reference diode at each temperature within the range of temperatures in accordance with the present invention.

FIG. 3 shows a block diagram that illustrates an example of a test set up 300 that measures threshold currents $I_{TH}$ and slope efficiencies SE of the reference laser diode at each temperature within the range of temperatures in accordance with the present invention. As shown in FIG. 3, set up 300 includes a base structure 310, a temperature detector 312 that is connected to base structure 310, and a variable cooling/heating source 314 that is connected to base structure 310 and temperature detector 312.

In operation, temperature detector 312 detects the temperature of base structure 310, and outputs a measured temperature signal MS. Cooling/heating source 314 receives a temperature signal TS that defines a desired temperature of base structure 310, and the measured temperature signal MS that defines the current temperature of base structure 310. In response, cooling/heating source 314 chills or heats base structure 310 to have the temperature defined by the temperature signal TS.

As further shown in FIG. 3, test set up 300 includes an optical power detector 316 and a controller 318. Optical power detector 316 detects the optical power of a light beam, and outputs an optical power signal OPS to controller 318 that identifies the magnitude of the received optical power.

Controller 318, in turn, outputs the temperature signal TS to cooling/heating source 314 to set the temperature of base structure 310, and a bias signal BS to a reference laser diode 320 that controls the magnitude of the bias current input to laser diode 320. Further, controller 318 receives the optical power signal OPS and, based on the received optical power, determines the threshold current level $I_{TH}$ of reference laser diode 320.

Figure 4:
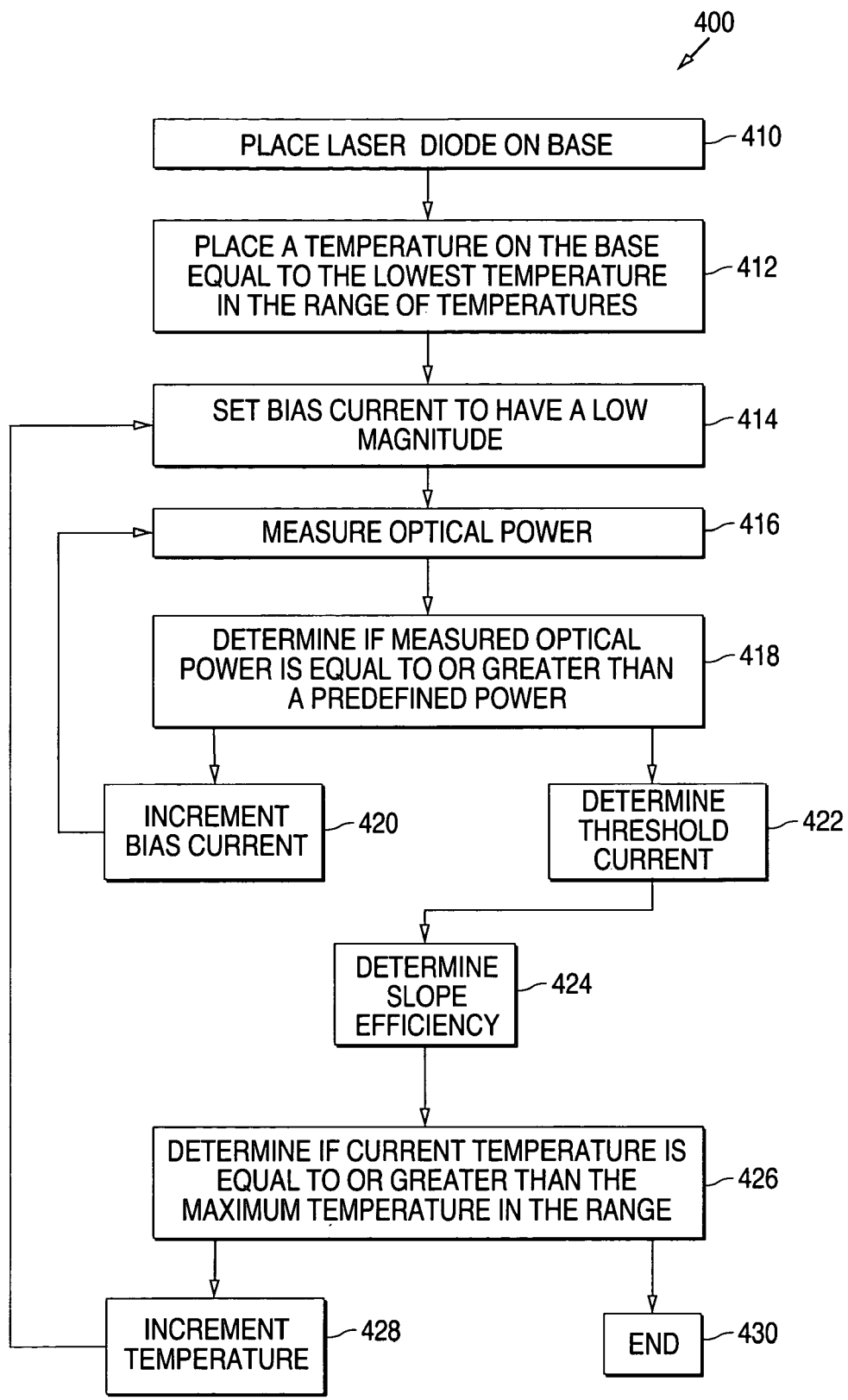
FIG. 4 is a flow chart illustrating an example of a method 400 of operating test set 300 up in accordance with the present invention.

FIG. 4 shows a flow chart that illustrates an example of a method 400 of operating test set 300 up in accordance with the present invention. As shown in FIG. 4, method 400 begins at step 410 by placing reference laser diode 320 on base structure 310 so that the temperature of the laser diode is defined by the temperature of base structure 310. In addition, reference laser diode 320 is aligned with optical power detector 316, and connected to receive the input bias signal BS.

Following this, method 400 moves to step 412 where controller 318 outputs the temperature signal TS with a value that places a temperature on base structure 310 equal to the lowest temperature of the range of temperatures. Next, method 400 moves to step 414 where controller 318 outputs the input bias signal BS with a value that causes the bias current to have a low magnitude.

After this, method 400 moves to step 416 to measure the optical power of the light output by reference laser diode 320, and then to step 418 to determine if the measured optical power is equal to or greater than a predefined power level, such as the optical power that corresponds with the operating point of the laser diode. If the measured optical power is less than the predefined power level, method 400 moves to step 420 where controller 318 changes the input bias signal BS to cause the bias current to be incremented by a predetermined amount.

Method 400 then returns to step 416 to measure the optical power of the light output by reference laser diode 320. Method 400 continues to loop through steps 420, 416, and 418 until the measured optical power is equal to or greater than the predefined optical power of reference laser diode 320.

Figure 5:
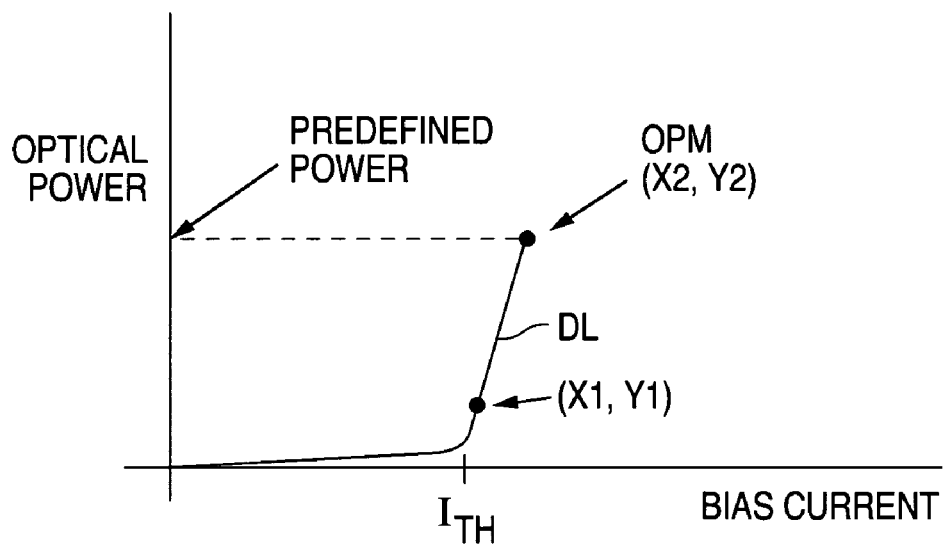
FIG. 5 is an optical power versus bias current graph in accordance with the present invention.

FIG. 5 shows an optical power versus bias current graph in accordance with the present invention. As shown in FIG. 5, once the measured optical power is equal to or greater than the predefined power of the reference diode for the first temperature setting, a diode line DL can be formed. As shown in FIG. 5, the diode line DL extends up to the operating point OPM, and includes the lower portion of a linear range of operation of reference diode 320.

Returning to FIG. 4, when the measured optical power is equal to or greater than the average optical power of reference laser diode 320, method 400 moves to step 422 to determine the threshold current ITH of reference laser diode 320. The threshold current ITH can be determined using any conventional algorithm for detecting the knee in a curve.

After the threshold current ITH has been determined, method 400 moves to step 424 to determine the slope of the diode line DL. As shown in FIG. 5, the slope can be graphically determined by, for example, using a first point (X1, Y1) on the diode line DL that is greater than the point of the threshold current ITH, and a second point (X2, Y2) on the diode line DL that coincides with, for example, the operating point OPM. (Slope=(Y2−Y1)/(X2−X1).)

Once the slope of the diode line has been determined, method 400 moves to step 426 to determine if the current temperature is equal to or greater than the maximum temperature of the range of temperatures. If the current temperature is less than the highest temperature of the range, method 400 moves to step 428 to change the temperature signal TS to a value that causes cooling/heating source 314 to increment the temperature of base structure 310 by a predetermined amount.

Method 400 then returns to step 414 where controller 318 outputs the input bias signal BS with a value that causes the bias current to have the low magnitude. Method 400 continues to loop until the threshold current ITH and the slope have been measured for each temperature increment within the range of temperatures. When, at step 426, the temperature is equal to or greater than the maximum temperature, method 400 moves to step 430 to end.

Figure 6:
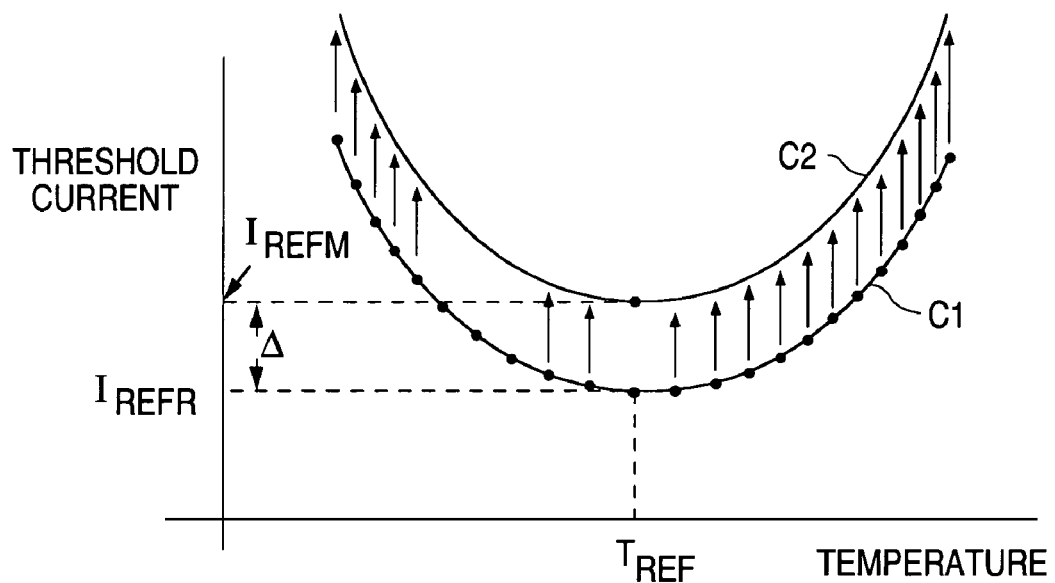
FIG. 6 is a threshold current versus temperature graph in accordance with the present invention.

FIG. 6 shows a threshold current versus temperature graph in accordance with the present invention. As shown in FIG. 6, a threshold current versus temperature curve C1 can be plotted once a diode line has been determined for each temperature increment in the range of temperatures for the reference diode. Curve C1 has a wide "U" shape indicating that the threshold current ITH falls as the temperature increases to a center point, then increases as the temperature increases beyond the center point.

Figure 7:
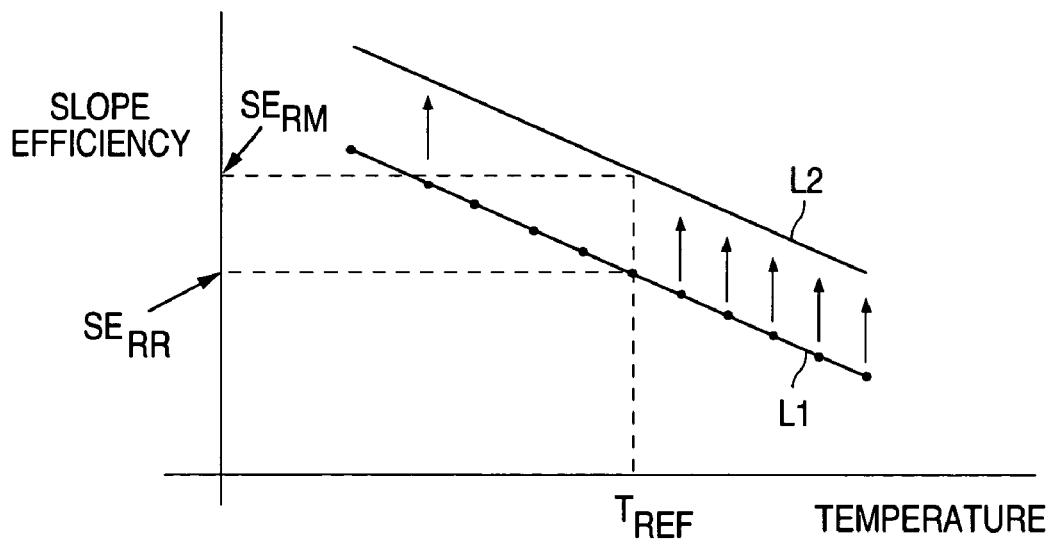
FIG. 7 is a slope efficiency versus temperature graph in accordance with the present invention.

FIG. 7 shows a slope efficiency versus temperature graph in accordance with the present invention. As shown in FIG. 7, a slope efficiency versus temperature curve L1 can be plotted once a diode line has been determined for each temperature increment in the range of temperatures for the reference diode.

Returning to FIG. 2, after the threshold currents $I_{TH}$ and slope efficiencies SE for the reference laser diode for the temperatures within the range of temperatures have been determined, method 200 moves to step 212. In step 212, method 200 identifies a reference temperature. The reference temperature is user defined, and is typically equal to 25° C.

Following this, method 200 moves to step 214 to determine a reference threshold current that corresponds with the reference temperature for the reference laser diode. FIG. 6 graphically illustrates the determination of a reference threshold current IREFR that corresponds with the reference temperature TREF for the reference laser diode.

After the reference threshold current IREFR has been determined, method 200 moves to step 216 to determine a measured threshold current of a laser diode from the selected laser diode array at the reference temperature.

To determine the measured threshold current of the laser diode from the selected laser diode array, the reference temperature TREF is applied to the laser diode, and the measured threshold current can be determined as described above. FIG. 6 graphically illustrates a measured threshold current IREFM that corresponds with the reference temperature TREF for the laser diode from the selected laser diode array.

After the measured threshold current of the laser diode from the selected laser diode array has been determined, method 200 moves to step 220 to determine the threshold currents of the laser diode from the selected laser diode array for each of the remaining temperatures in the range of temperatures.

The present invention assumes that each of the laser diodes in an array has a similarly shaped threshold current versus temperature curve. The present invention further assumes that the variations between arrays cause the threshold current versus temperature curves to be vertically offset, and that any horizontal variations are relatively minor.

Method 200 utilizes the offset to determine the threshold currents for the laser diodes in the selected laser diode array for each of the remaining temperatures. As graphically shown in FIG. 6, a threshold current versus temperature curve C2 can be plotted for the laser diodes in selected laser diode array based on the offsets. As further shown in FIG. 6, the threshold current versus temperature curves C1 and C2 for the reference diode and the selected laser diode array are substantially the same and vertically offset.

Following this, method 200 moves to step 222 to determine a reference slope efficiency that corresponds with the reference temperature of the reference diode. FIG. 7 graphically illustrates the determination of a reference slope efficiency SERR that corresponds with the reference temperature TREF.

After the reference slope efficiency SERR has been determined, method 200 moves to step 224 to determine a measured slope efficiency for the laser diode from the selected laser diode array at the reference temperature.

To determine the measured slope efficiency of the laser diode from the selected laser diode array, the reference temperature TREF is applied to the laser diode from the selected diode array, and the slope efficiency can be determined as described above. FIG. 7 graphically illustrates a measured slope efficiency SERM that corresponds with the reference temperature TREF for the laser diode from the selected laser diode array.

After the measured slope efficiency for the laser diode from the selected laser diode array has been determined, method 200 moves to step 226 to determine the slope efficiencies of the laser diode from the selected laser diode array for each of the remaining temperatures in the range of temperatures.

The present invention assumes that each of the laser diodes in the array has a similarly shaped slope efficiency versus temperature curve. The present invention further assumes that the variations between arrays cause the slope efficiency versus temperature curves to be vertically offset, and that any horizontal variations are relatively minor.

Method 200 utilizes the offset to determine the slope efficiencies for the laser diode from the selected laser diode array for each of the remaining temperatures. As graphically shown in FIG. 7, a slope efficiency versus temperature curve L2 can be plotted for the laser diode from the selected laser diode array based on the offsets. As further shown in FIG. 7, the slope efficiency versus temperature curves L1 and L2 for the reference diode and the selected laser diode array are substantially the same and vertically offset.

Once the slope efficiencies for the selected laser diode array for each of the remaining temperatures in the range of temperatures have been determined, method 200 ends.

Returning to FIG. 1, after the threshold currents $I_{TH}$ and slope efficiencies SE for the selected laser diode array have been determined for the temperatures within the range of temperatures, method 100 moves to step 114. In step 114, method 100 determines the maximum and minimum bias currents IMAX and IMIN for the laser diodes in the selected laser diode array for each temperature in the range of temperatures using the threshold currents and slope efficiencies.

Figure 8A:
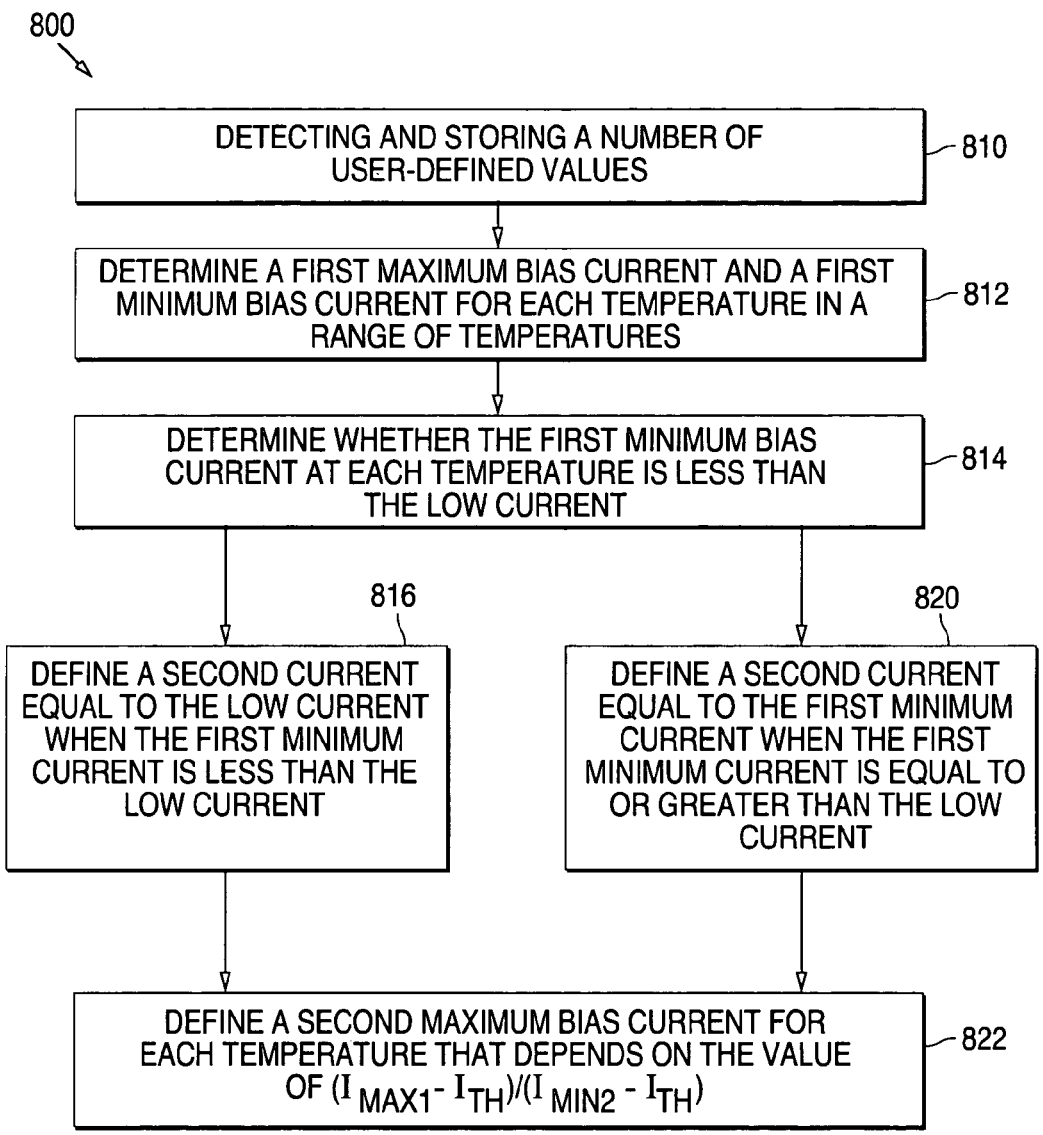
FIGS. 8A–8D are a flow chart illustrating an example of a method 800 of determining the maximum and minimum bias currents IMAX and IMIN of the diodes in an array at each temperature in a range of temperatures in accordance with the present invention.
Figure 8B:
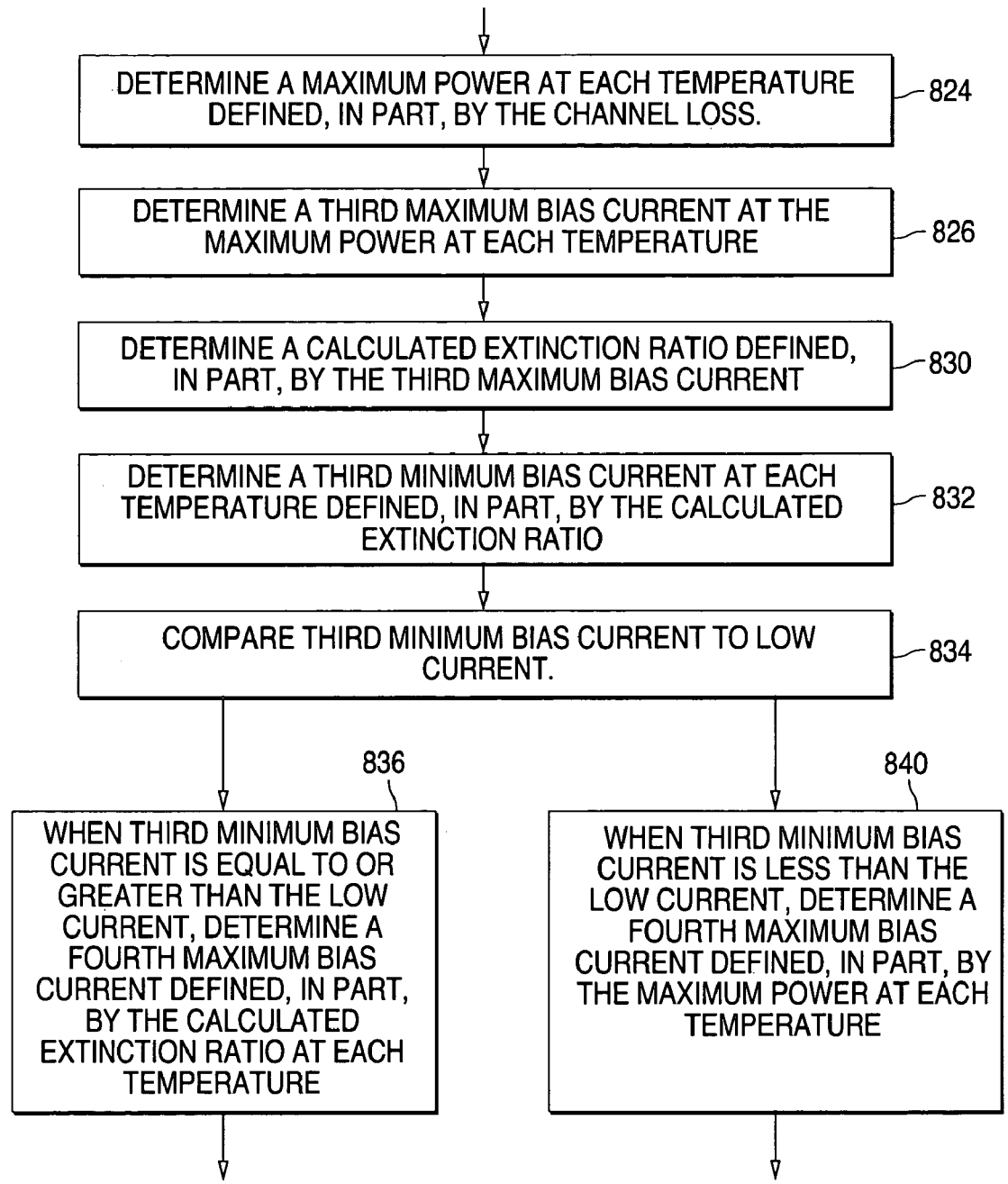
Figure 8C:
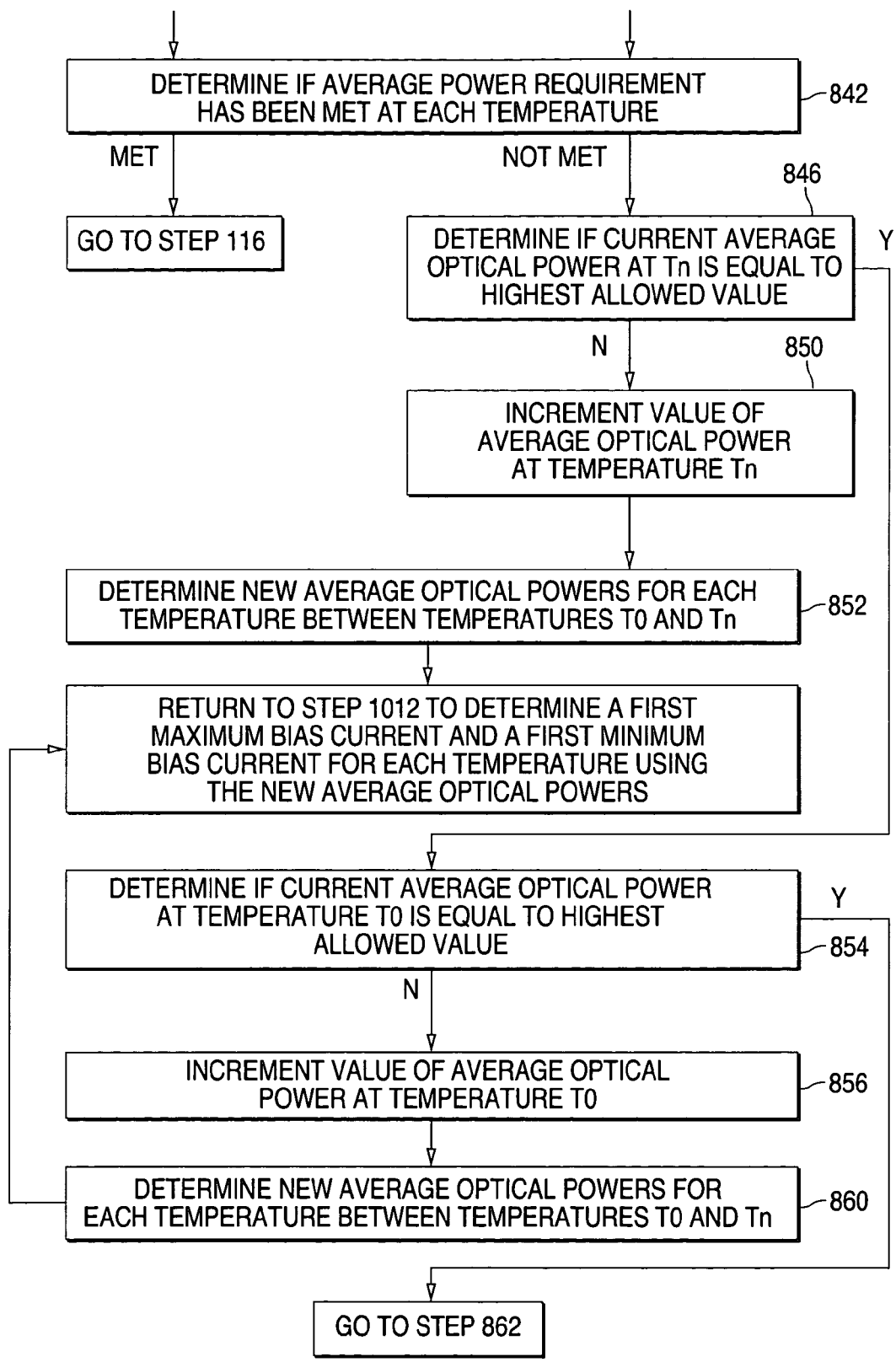
Figure 8D:
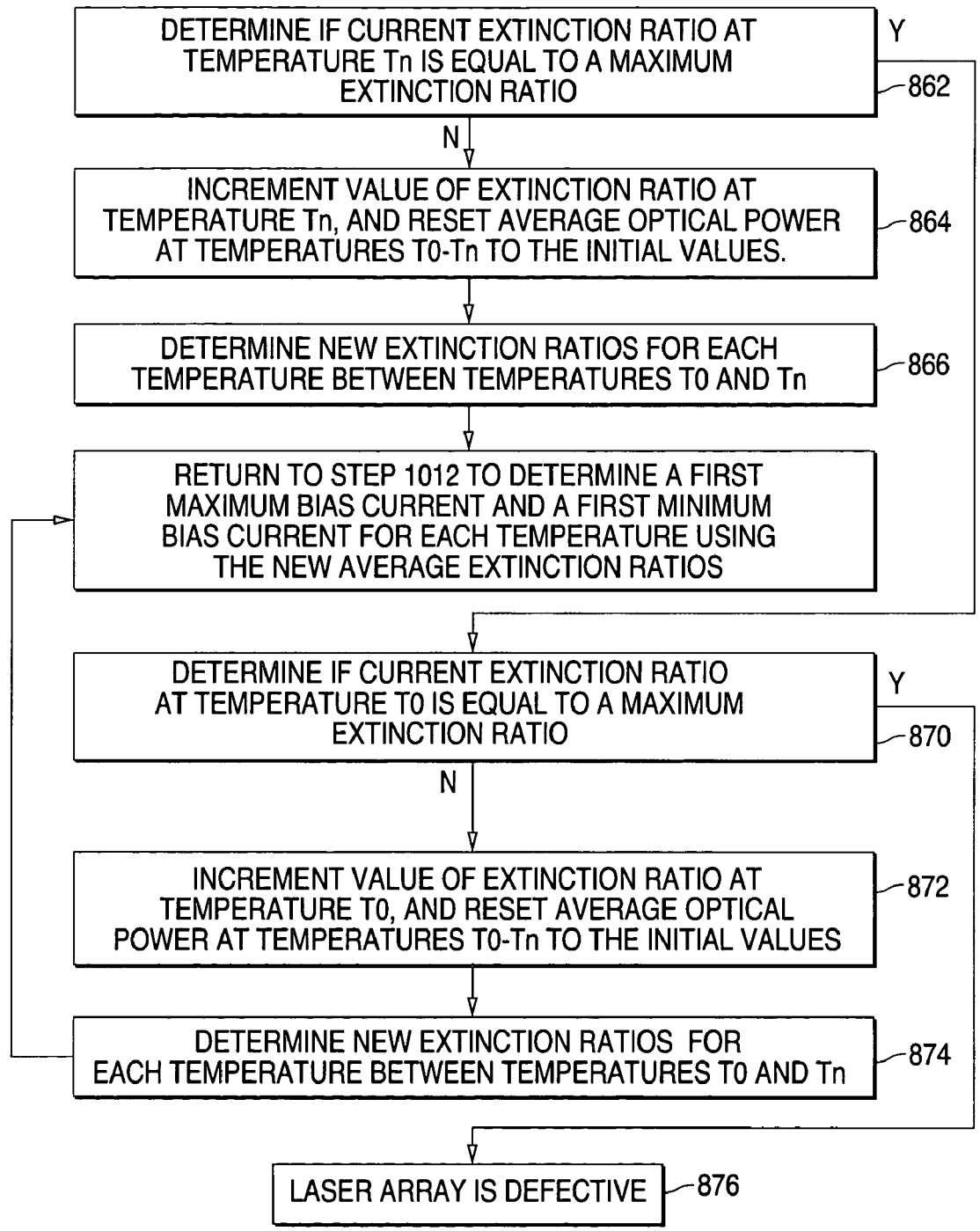

FIGS. 8A–8D show a flow chart that illustrates an example of a method 800 of determining the maximum and minimum bias currents IMAX and IMIN of the diodes in an array at each temperature in a range of temperatures in accordance with the present invention. As shown in FIG. 8A, method 800 begins at step 810 by detecting and storing a number of user-defined values. The user-defined values include a range of temperatures T0–Tn, a number of temperatures in the range of temperatures, and a range of average optical powers.

For example, a range of temperatures T0–Tn can include 0° C. to 80° C., while the number of temperatures in the range can include 0° C., 10° C., 20° C., ... 70° C., and 80° C. In addition, the range of average optical powers can include, for example, 0.7 mW to 1.2 mW. In this example, as the temperature varies between 0° C. and 80° C., the average optical power must fall within the range of 0.7 mW to 1.2 mW.

The user-defined values also include a range of extinction ratios, and a low current ILOW for each temperature in the range of temperatures. In this example, the lowest extinction ratio in the range of extinction ratios is defined to be an initial extinction ratio. Similarly, the lowest average optical power in the range of average optical powers is defined to be an initial average optical power. In the present example, the initial average optical power is 0.7 mW.

Further, the low current ILOW of a temperature in the range of temperatures is the sum of the threshold current ITH at the temperature and an offset current IOFFSET. The offset current IOFFSET is set to a value determined by the characteristics of the components, and represents the lowest bias current that is allowed. In addition to the extinction ratios and the low current ILOW, the values further include a threshold current for each temperature in the range of temperatures, and an average channel loss of the diodes in the array.

Once the user-defined values have been detected and stored, method 800 moves to step 812. In step 812, method 800 determines a first maximum bias current IMAX1 and a first minimum bias current IMIN1 for each temperature in the range of temperatures using an average optical power from the range of average optical powers and an extinction ratio from the range of extinction ratios.

For each temperature, the first maximum bias current IMAX1 can be determined with the following equation:

$$I_{MAX1}=(2*PAVG*ER/SE+(ER+1)*ITH)/(ER+1)$$

where PAVG is the average optical power, ER is the extinction ratio, SE is the slope efficiency that corresponds with the temperature, and ITH is the threshold current that corresponds with the temperature.

In the present example, the first maximum bias current IMAX1 is determined for each temperature in the range of temperatures using the initial average optical power and the initial extinction ratio. For example, the first maximum current IMAX1 for temperature T0 can be determined with, for example, the following equation:

$$I_{MAX1-T0}=(2*PAVGi*ERi/SE_{T0}+(ERi+1)*ITH_{T0})/(ERi+1)$$

where PAVGi is the initial average optical power, ERi is the initial extinction ratio, $SE_{T0}$ is the slope efficiency that corresponds with temperature T0, and $ITH_{T0}$ is the threshold current that corresponds with temperature T0.

The equation is used with each temperature to determine values to complete the IMAX1 column of the following table.

| Temp | Pavg | ER | ITH | SE | ILOW | IMAX1 | IMIN1 | IMAX2 | IMIN2 |
|---|---|---|---|---|---|---|---|---|---|
| T0 (0° C.) | initial 0.7 mW | initial | value | value | Value | | | | |
| T1 (10° C.) | initial 0.7 mW | initial | value | value | Value | | | | |
| T2 (20° C.) | initial 0.7 mW | initial | value | value | Value | | | | |
| Tn (80° C.) | initial 0.7 mW | initial | value | value | Value | | | | |

Once the IMAX1 column has been completed, method 800 determines the first minimum bias current IMIN1. For each temperature, the first minimum bias current IMIN1 can be determined with the following equation:

$$IMIN1=2*PAVG/SE+2*ITH-IMAX1.$$

In the present example, the first minimum bias current IMIN1 is determined for each temperature in the range of temperatures using the initial average optical power. For example, the first minimum current IMIN1 for temperature T0 can be determined with, for example, the following equation:

$$IMIN1_{T0}=2*PAVGi/SE_{T0}+2*ITH_{T0}-IMAX1.$$

The equation is used with the slope efficiency and threshold current of each temperature to determine values to complete the IMIN1 column of the above table.

After the first maximum and minimum bias currents IMAX1 and IMIN1 have been determined, method 800 moves to step 814. In step 814, method 800 determines a second minimum bias current IMIN2 for each temperature that depends on whether the first minimum bias current IMIN1 at a temperature is less than the low current ILOW at the temperature.

When the first minimum current IMIN1 at a temperature is less than the low current ILOW, method 800 moves to step 816 where the second minimum current IMIN2 is defined as IMIN2=ILOW. On the other hand, when the first minimum current IMIN1 is equal to or greater than the low current ILOW, method 800 moves to step 820 where the second minimum current IMIN2 is defined as IMIN2=IMIN1.

Following this, method 800 moves from either step 816 or step 820 to step 822. In step 822, method 800 determines a second maximum bias current IMAX2 for each temperature that depends on whether the value (IMAX1−ITH)/(IMIN2−ITH) is greater than or equal to the current extinction ratio. Thus, in the present example, method 800 determines if (IMAX1−ITH)/(IMIN2−ITH)≧ERi.

If (IMAX1−ITH)/(IMIN2−ITH)≧ERi, then the second maximum bias current IMAX2 can be calculated with the following equation:

$$IMAX2=(2*ERi*IAVG-(ERi-1)*ITH)/(ERi+1)$$

where IAVG=(IMAX1+IMIN2)/2.

Alternately, if (IMAX1−ITH)/(IMIN2−ITH)<ERi, then the second maximum bias current IMAX2 can be calculated with the following equation:

$$IMAX2=ERi*(IMIN2-ITH)+ITH.$$

The above calculations have to be performed to determine the second maximum and minimum bias currents IMAX2 and IMIN2 at every temperature between To and Tn because the extinction ratio at each temperature can be varying due to the laser characteristics and the initial conditions ERi and Pavgi.

If the channel loss of a channel is M, as determined by measurements in step 110, then the output power of the channel before compensation is:

$$PMAX=SE*(IMAX2-ITH)*(1-M).$$

Following this, method 800 moves to step 826 to determine a third maximum bias current IMAX3 at the maximum power for each laser diode and channel when the launched optical power is increased by 1/(1−M) to compensate for the channel loss, where M represents the channel loss of a diode of an array.

The third maximum bias current IMAX3 can be calculated for each temperature for each laser diode and channel with, for example, the following equation:

$$IMAX3=PMAX/(1-M)/SE+ITH.$$

The third maximum bias current IMAX3 represents the maximum bias current at maximum optical power with a channel loss of M.

Following this, method 800 moves to step 830 to determine a calculated extinction ratio ERC for each laser diode and channel using, for example, the following equation:

$$ERC=(IMAX3-ITH)/(IMIN2-ITH).$$

Next, method 800 moves to step 832 to determine a third minimum bias current IMIN3 for each temperature and each laser diode and channel using the calculated extinction ratio ERC with, for example, the following equation:

$$IMIN3=(IMAX3-ITH)/ERC+ITH.$$

After the third minimum bias current IMIN3 has been determined for each temperature for each laser diode and channel, method 800 moves to step 834 to compare the third minimum bias current IMIN3 to the low current ILOW (ITH+IOFFSET) to determine if the extinction ratio requirement has been met.

The extinction ratio requirement is met when the third minimum bias current IMIN3 of a laser diode and channel is equal to or greater than the low current ILOW. In this case, method 800 moves to step 836 to determine a fourth maximum bias current IMAX4 for each laser diode and channel using, for example, the following equation:

$$IMAX4=ERC*IOFFSET/(1-M)+ITH,$$

where IOFFSET is the offset current.

The extinction ratio requirement is missed when the third minimum bias current IMIN3 is less than the low current ILOW. In this case, method 800 moves to step 840 to determine the fourth maximum bias current IMAX4 at each temperature for each laser diode and channel using, for example, the following equation:

$$IMAX4 = PMAX/SE/(1-M) + ITH.$$

Following this, method 800 moves from step 836 or step 840 to step 842 to determine if the average power requirement has been met at each temperature for each laser diode and channel. To determine this, method 800 determines a calculated average power PAVGC for each temperature and laser diode and channel using the following equation:

$$PAVGC = SE/2*(IMAX4 + IMIN3 - 2*ITH).$$

When the calculated average power PAVGC for each temperature for each laser diode and channel falls within the range of user-defined average optical powers, method 800 moves to step 116 of FIG. 3. In step 116, method 100 adds the second maximum bias current IMAX2 and the second minimum bias current IMIN2 at each temperature to the following temperature compensation table.

Temperature Compensation Table

| Temperature | IMAX | IMIN | ITH |
|---|---|---|---|
| T0 | | | |
| T1 | | | |
| T2 | | | |
| T3 | | | |
| ... | | | |
| Tn | | | |

Temperature Compensation Table

Returning again to FIGS. 8A–8D, when method 800 determines that the calculated average power PAVGC at any temperature for any of the laser diodes and channels in the array falls outside of the range of user-defined average optical powers, method 800 moves to step 846. In step 846, method 800 determines if the current average optical power PAVG at temperature Tn (which is the initial average optical power the first time through) is equal to the highest allowed average optical power PAVG.

When the average optical power PAVG at temperature Tn is less than the maximum, method 800 moves to step 850 to increment the value of the average optical power PAVG at temperature Tn. Method 800 next moves to step 852 to determine new average optical power values PAVG for each temperature between temperatures T0 and Tn based on a line that connects the two values T0 and Tn.

Figure 9:
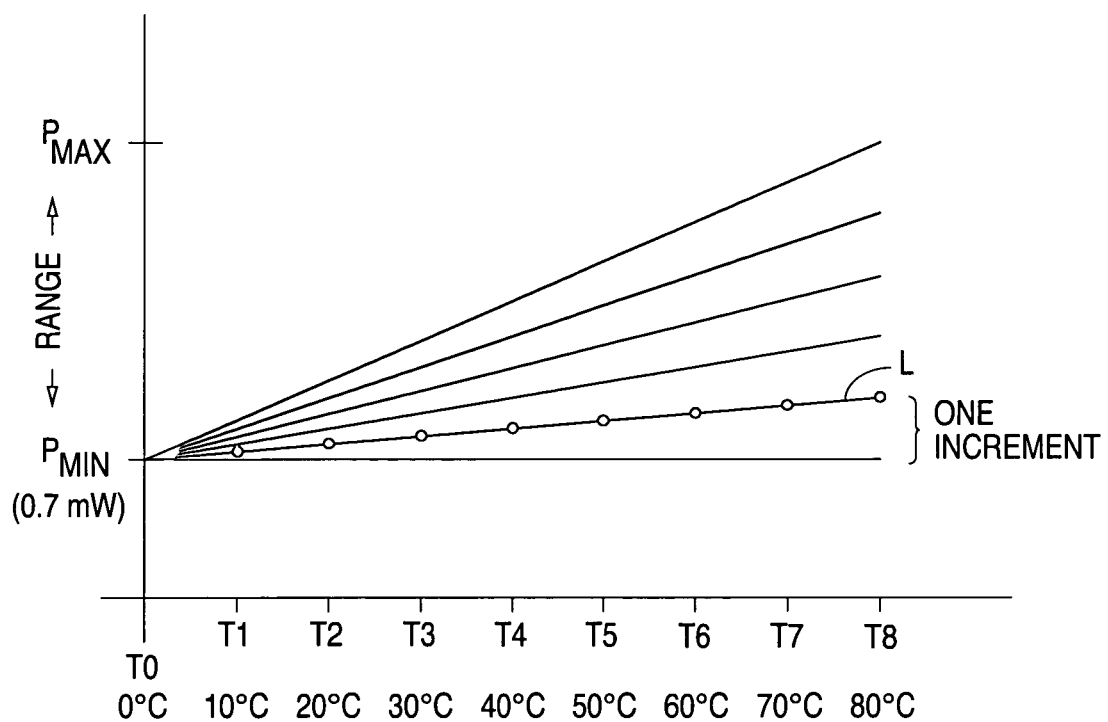
FIG. 9 is a graph illustrating the determination of new average optical power values PAVGN at each temperature between temperatures T0 and Tn as the average optical power at temperature Tn increases from a minimum value to a maximum value in accordance with the present invention.

FIG. 9 shows a graph that illustrates the determination of new average optical power values at each temperature between temperatures T0 and Tn as the average optical power at temperature Tn increases from a minimum value to a maximum value in accordance with the present invention.

As shown in FIG. 9, when the average optical power at temperature Tn is incremented, the new average optical power values for each temperature between temperatures T0 and Tn can be graphically determined from lines that run between temperatures T0 and Tn. When the average optical power at temperature Tn is increased from the initial optical power, the new average optical powers for the temperatures between T0 and Tn can be graphically determined from line L. (Although a straight line is shown, a curved line can also be used.)

After the new average optical power values have been determined, the following table can be completed as shown.

| Temp | Pavg | ER | ITH | SE | ILOW | IMAX1 | IMIN1 | IMAX2 | IMIN2 |
|---|---|---|---|---|---|---|---|---|---|
| T0 (0° C.) | initial 0.7 mW | initial | value | value | value | | | | |
| T1 (10° C.) | new PAV GN | initial | value | value | value | | | | |
| T2 (20° C.) | new PAV GN | initial | value | value | value | | | | |
| Tn (80° C.) | new PAV GN | initial | value | value | value | | | | |

Method 800 next moves to step 812 to determine a first maximum bias current IMAX1 and a first minimum bias current IMIN1 for each temperature in the range of temperatures using the average optical powers shown in the above table.

This process continues until the calculated average optical power for each laser diode and channel of the array falls within the user-defined range of average optical powers at each temperature, or method 800 determines in step 846 that the current average optical power PAVG at temperature Tn is equal to the highest allowed average optical power PAVG.

In this case, method 800 moves to step 854 to determine if the current average optical power at temperature T0 (which is the initial average optical power the first time through) is equal to the highest allowed average optical power. When the average optical power at temperature T0 is less than the maximum, method 800 moves to step 856 to increment the value of the average optical power at temperature T0, and reset the average optical power at temperature Tn to the initial value. Method 800 next moves to step 860 to determine new average optical power values for each temperature between temperatures T0 and Tn based on a line that connects the two values T0 and Tn.

Figure 10:
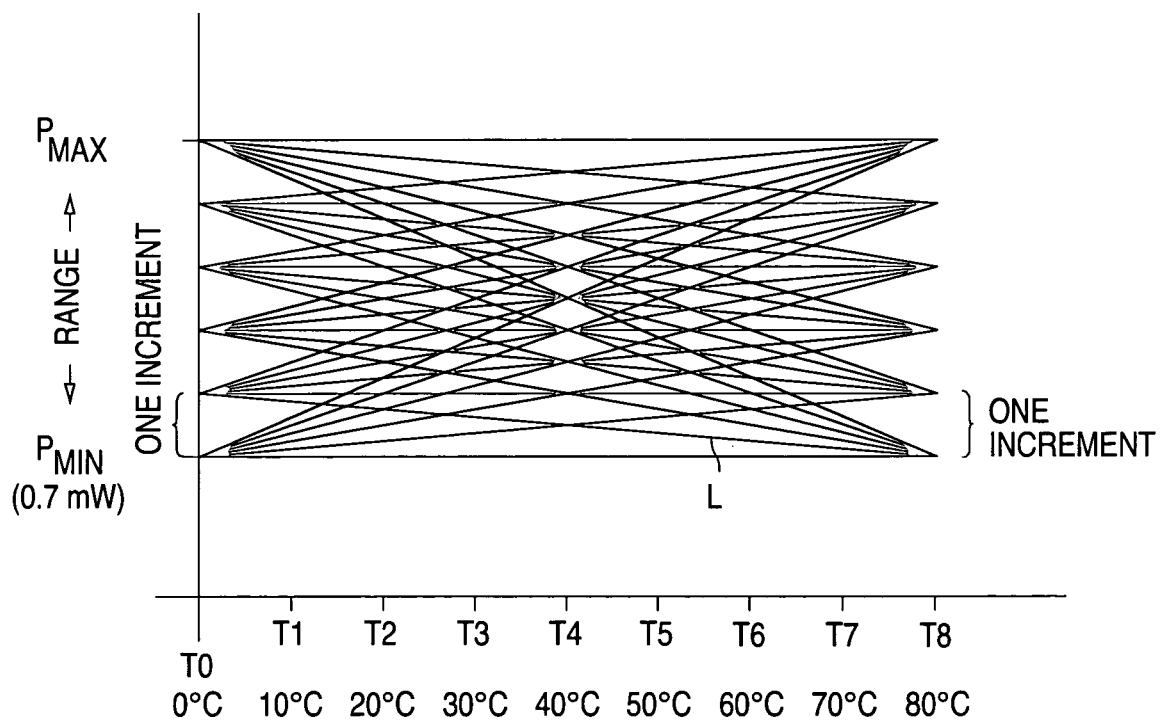
FIG. 10 is a graph illustrating the determination of new average optical power values PAVGN at each temperature between temperatures T0 and Tn as the average optical power at temperature T0 increases from the initial value to a maximum value in accordance with the present invention.

FIG. 10 shows a graph that illustrates the determination of new average optical power values at each temperature between temperatures T0 and Tn as the average optical power at temperature T0 increases from the initial value to a maximum value in accordance with the present invention.

As shown in FIG. 10, when the average optical power at temperature T0 is incremented, the new average optical power values for each temperature between temperatures T0 and Tn can be graphically determined from the lines that run between temperatures T0 and Tn. When the average optical power at temperature T0 is increased from the initial optical power, the new average optical powers for the temperatures between T0 and Tn can be graphically determined from line L.

After the new average optical power values have been determined, the following table can be completed as shown.

| Temp | Pavg | ER | ITH | SE | ILOW | IMAX1 | IMIN1 | IMAX2 | IMIN2 |
|---|---|---|---|---|---|---|---|---|---|
| T0 (0° C.) | new | | initial | value | value | value | | | |
| T1 (10° C.) | new | | initial | value | value | value | | | |
| T2 (20° C.) | new | | initial | value | value | value | | | |
| Tn (80° C.) | initial PAVG | | initial | value | value | value | | | |

Method 800 next moves to step 812 to determine a first maximum bias current IMAX1 and a first minimum bias current IMIN1 for each temperature in the range of temperatures using the average optical powers shown in the above table.

This process continues until the calculated average optical power for each laser diode and channel in the array falls within the user-defined range of average optical powers, or method 800 determines in step 854 that the current average optical power PAVG at temperature T0 is equal to the highest allowed average optical power PAVG.

In this case, method 800 moves to step 862 to determine if the current extinction ratio at temperature Tn (which is the initial extinction ratio ERi the first time through) is equal to the maximum extinction ratio. When the extinction ratio ER at temperature Tn is less than the maximum, method 800 moves to step 864 to increment the value of the extinction ratio ER at temperature Tn, and reset the average optical power PAVG at temperatures T0–Tn to the initial values. Method 800 next moves to step 866 to determine new extinction ratios ER for each temperature between temperatures T0 and Tn based on a line that connects the two values T0 and Tn.

Figure 11:
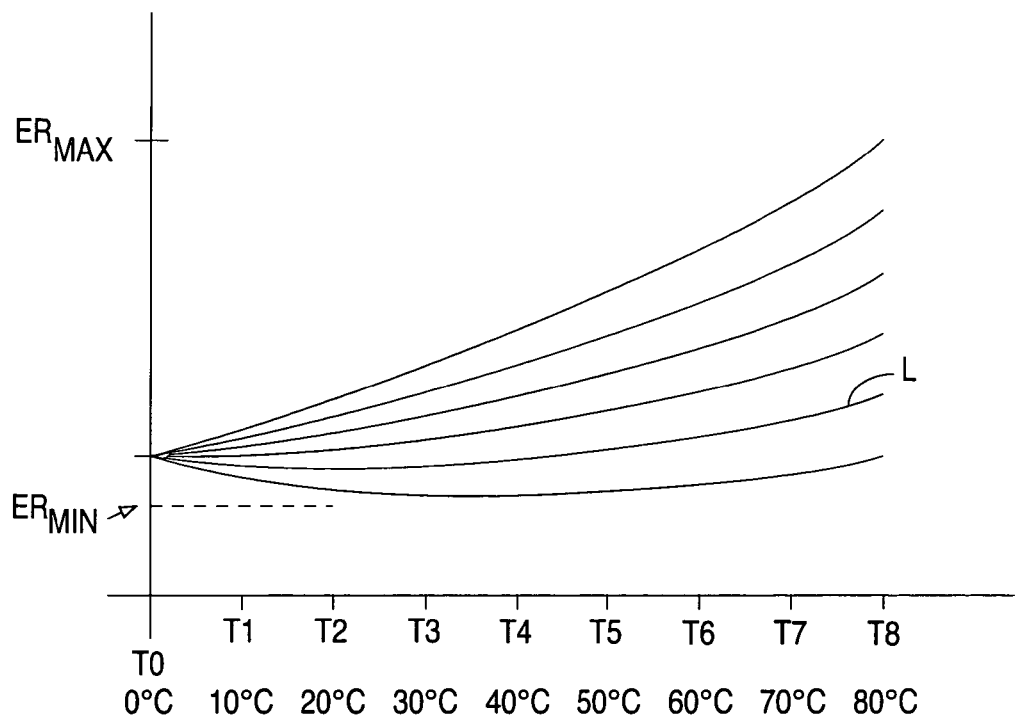
FIG. 11 is a graph illustrating the determination of new extinction ratios ERN at each temperature between temperatures T0 and Tn as the extinction ratio at temperature Tn increases from the initial value to a maximum value in accordance with the present invention.

FIG. 11 shows a graph that illustrates the determination of new extinction ratios ERN at each temperature between temperatures T0 and Tn as the extinction ratio at temperature Tn increases from the initial value to a maximum value in accordance with the present invention.

As shown in FIG. 11, when the extinction ratio at temperature Tn is incremented, the new extinction ratios ERN for each temperature between temperatures T0 and Tn can be graphically determined from the lines that run between temperatures T0 and Tn. When the extinction ratio at temperature Tn is increased from the initial extinction ratio, the new extinction ratios for the temperatures between T0 and Tn can be graphically determined from line L.

After the new extinction ratios have been determined, the following table can be completed as shown.

Method 800 next moves to step 812 to determine a first maximum bias current IMAX1 and a first minimum bias current IMIN1 for each temperature in the range of temperatures using the average optical powers and extinction ratios shown in the above table.

This process continues until the calculated average optical power PAVGC for each laser diode and channel of the array falls within the user-defined range of average optical powers, or method 800 determines in step 862 that the current extinction ratio ER at temperature Tn is equal to the highest extinction ratio.

When the current extinction ratio ER at temperature Tn is equal to the highest extinction ratio, method 800 moves to step 870 to determine if the current extinction ratio ER at temperature T0 (which is the initial extinction ratio the first time through) is equal to the highest extinction ratio.

When the extinction ratio ER at temperature T0 is less than the maximum, method 800 moves to step 872 to increment the value of the extinction ratio ER at temperature T0. Method 800 next moves to step 874 to determine new extinction ratios ERN for each temperature between temperatures T0 and Tn based on a line that connects the two values T0 and Tn.

Figure 12:
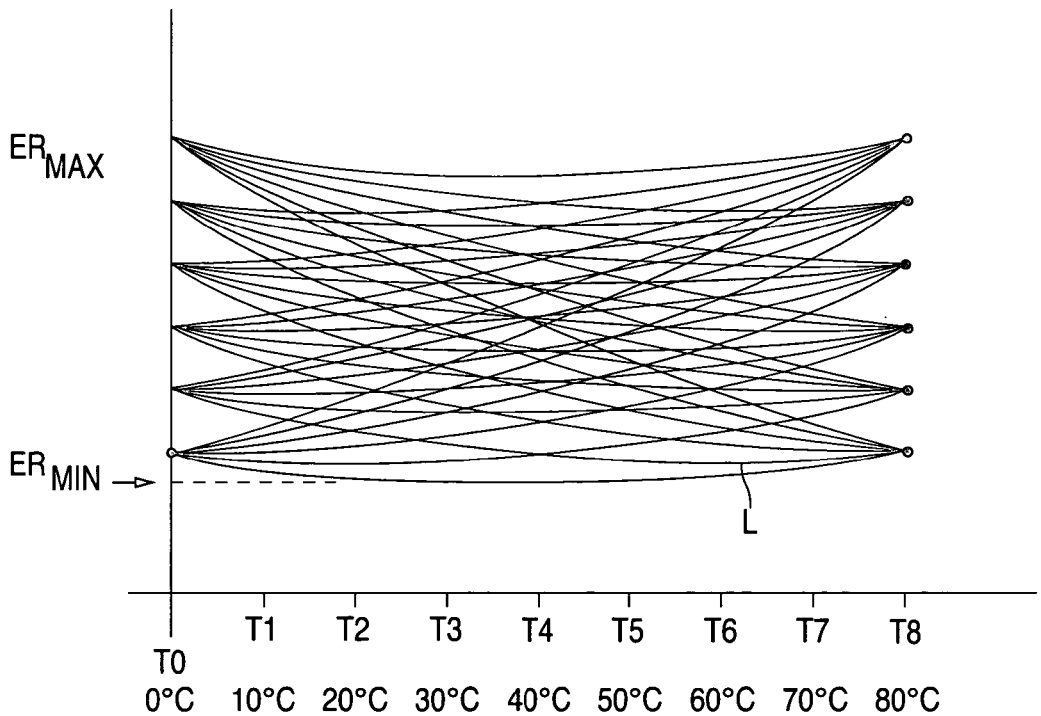
FIG. 12 is a graph illustrating the determination of new extinction ratios ERN at each temperature between temperatures T0 and Tn as the extinction ratio of temperature T0 increases from the initial extinction ratio to a maximum value in accordance with the present invention.

FIG. 12 shows a graph that illustrates the determination of new extinction ratios ERN at each temperature between temperatures T0 and Tn as the extinction ratio at temperature T0 increases from the initial extinction ratio to a maximum value in accordance with the present invention.

As shown in FIG. 12, when the extinction ratio at temperature T0 is incremented, the new extinction ratios ERN for each temperature between temperatures T0 and Tn can be graphically determined from the lines that run between temperatures T0 and Tn. When the extinction ratio at temperature T0 is increased from the initial extinction ratio, the new extinction ratios for the temperatures between T0 and Tn can be graphically determined from line L.

After the new extinction ratios have been determined, the following table can be completed as shown.

| Temp | Pavg | ER | ITH | SE | ILOW | IMAX1 | IMIN1 | IMAX2 | IMIN2 |
|---|---|---|---|---|---|---|---|---|---|
| T0 (0° C.) | initial | initial | value | value | value | | | | |
| T1 (10° C.) | initial | new | value | value | value | | | | |
| T2 (20° C.) | initial | new | value | value | value | | | | |
| Tn (80° C.) | initial | new | value | value | value | | | | |

| Temp | Pavg | ER | ITH | SE | ILOW | IMAX1 | IMIN1 | IMAX2 | IMIN2 |
|---|---|---|---|---|---|---|---|---|---|
| T0 (0° C.) | initial | initial | Value | value | value | | | | |
| T1 (10° C.) | initial | New | Value | value | value | | | | |
| T2 (20° C.) | initial | New | Value | value | value | | | | |
| Tn (80° C.) | initial | New | Value | value | value | | | | |

Method 800 next moves to step 812 to determine a first maximum bias current IMAX1 and a first minimum bias current IMIN1 for each temperature in the range of temperatures using the average optical powers and new extinction ratios shown in the above table.

This process continues until the calculated average optical power PAVGC for each laser diode and channel in the array falls within the user-defined range of average optical powers, or method 800 determines in step 870 that the current extinction ratio at temperature T0 is equal to the highest extinction ratio.

When the current extinction ratio ER is equal to the highest extinction ratio, method 800 moves to step 876 to end. In this case, the laser diode is rejected as faulty.

Thus, the present invention either identifies a laser diode array as faulty, or a maximum bias current and a minimum bias current IMAX and IMIN at each temperature within a range of temperatures that provides a relatively constant average optical power over temperature.

Method 800 provides a number of advantages. The present invention determines the IMAX and IMIN values that meet the user-defined PAVG and ER constraints. This allows a high yield, the lowest average current, and lowest average power level, which increases reliability. In addition, this allows a high extinction ratio ER, and a small table size.

Referring again to FIG. 1, when the second maximum and minimum bias currents IMAX2 and IMIN2 have been stored in the temperature compensation table in step 116, method 100 also adds the channel loss of the diodes in the array to a channel loss table. Following this, method 100 moves to step 120 to generate a maximum and a modulated bias current that are defined by the values in the temperature compensation and channel loss tables.

Figure 13:
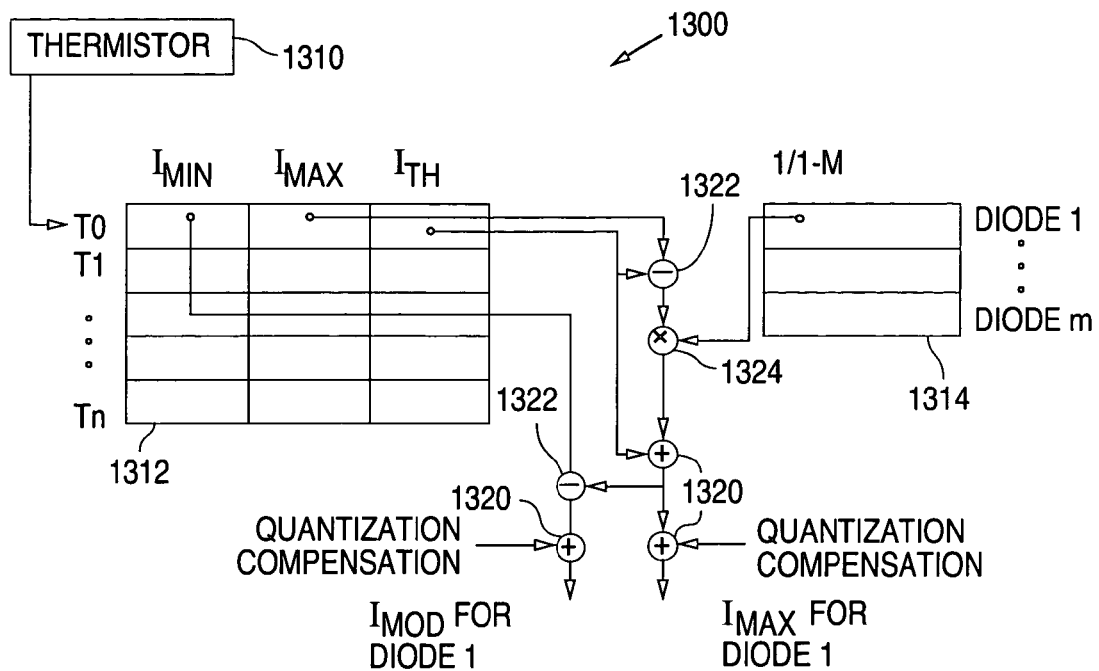
FIG. 13 is a block diagram illustrating a circuit 1300 that determines the maximum bias current IMAX and a modulated current IMOD based on temperature and channel conditions in accordance with the present invention.

FIG. 13 shows a block diagram that illustrates a circuit 1300 that generates a maximum bias current IMAX and a modulated current IMOD based on temperature and channel conditions in accordance with the present invention. As shown in FIG. 13, circuit 1300 includes a thermistor 1310 that detects the current temperature, a temperature compensation table 1312 for an array of diodes, and a channel compensation table 1314 that includes entries for each laser diode in the array. In addition, circuit 1300 includes a number of adders 1320, a number of subtractors 1322, and a multiplier 1324.

In operation, circuit 1300 generates the maximum bias current IMAX and the modulation current IMOD to use with the laser diodes in the array by detecting the current temperature, and outputting IMAX, IMIN, and ITH values that correspond with the current temperature. After this, the ITH value is subtracted from the IMAX value (IMAX−ITH) to form a first value.

Next, the first value is multiplied times the channel loss value of a to-be-compensated diode in the array to form a second value for the to-be-compensated diode in the array. The ITH value is then added to the second value to form a third value that can be output as the maximum bias current IMAX to the to-be-compensated diode. In addition, the IMIN value is subtracted from the third value to form a fourth value that can be output as the modulated bias current IMOD.

The following equations represent the above steps:

$$IMAX = (IMAX - ITH)/(1-M) + ITH, \text{ and}$$

$$IMOD = IMAX - IMIN.$$

Alternately, rather than using IMOD (IMOD=IMAX−IMIN), the minimum bias current IMIN can be used depending on the laser driver circuit design. In addition, as shown in FIG. 13, compensation for quantization errors can be added to both the maximum bias current IMAX and the modulated bias current IMOD.

As described above, the threshold currents for the remaining laser diodes in the array are calculated based on the vertical offset of the threshold current versus temperature graphs. In the event that two or more laser diodes are measured for each value in the same manner as the reference diode, then a value ITH_M is determined.

ITH_M represents the minimum difference between any point on the threshold current versus temperature graph of the reference diode and a corresponding point of the threshold current versus temperature graph of a remaining diode. When the ITH_M value is available circuit 1300 is modified to take this value into account.

Figure 14:
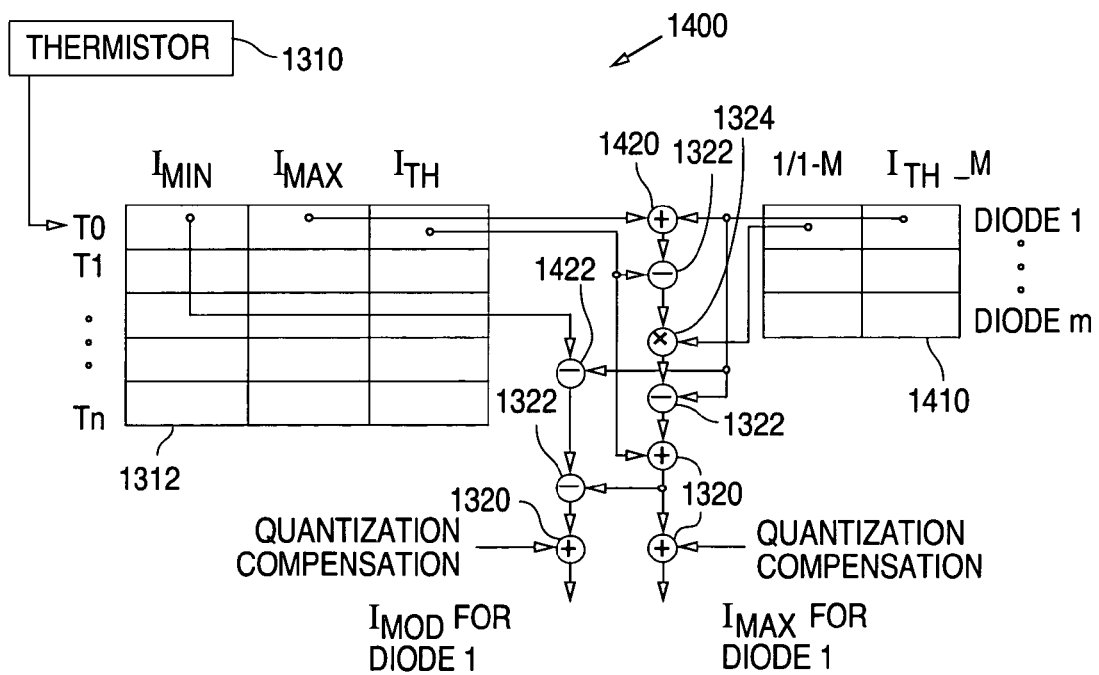
FIG. 14 is a block diagram illustrating a circuit 1400 that determines the maximum bias current IMAX and a modulated current IMOD based on temperature and channel conditions in accordance with the present invention.

FIG. 14 shows a block diagram that illustrates a circuit 1400 that determines the maximum bias current IMAX and a modulated current IMOD based on the temperature in accordance with the present invention. Circuit 1400 is similar to circuit 1300 and, as a result, utilizes the same reference numerals to designate the structures which are common to both circuits.

As shown in FIG. 14, circuit 1400 differs from circuit 1300 in that circuit 1400 has channel compensation table 1410 that includes a column for a ITH_M value for one or more of the laser diodes in the array, an additional adder 1420, and an additional subtractor 1422.

In operation, circuit 1400 generates the maximum bias current IMAX and the modulation current IMOD to use with the laser diodes in the array by detecting the current temperature, and outputting IMAX, IMIN, and ITH values that correspond with the current temperature. After this, the IMAX value and the ITH_M value are added together to form a first value.

Next, the ITH value is subtracted from the first value to form a second value. Following this, the second value is multiplied times the channel loss value of a to-be-compensated diode in the array to form a third value for the to-be-compensated diode in the array. The ITH_M value is then subtracted from the third value to form a fourth value.

The ITH value is then added to the fourth value to form a fifth value that can be output as the maximum bias current IMAX to the to-be-compensated diode. In addition, the IMIN value is subtracted from the fifth value to form a sixth value that can be output as the modulated bias current IMOD. In addition, as shown in FIG. 14, compensation for quantization errors can be added to both the maximum bias current IMAX and the modulated bias current IMOD.

The following equations represent the above steps:

$$IMAX=(IMAX-ITH+ITH\_M)/(1-M)+ITH-ITH\_M,$$
and $$IMOD=IMAX-(IMIN-ITH\_M).$$

Figure 15:
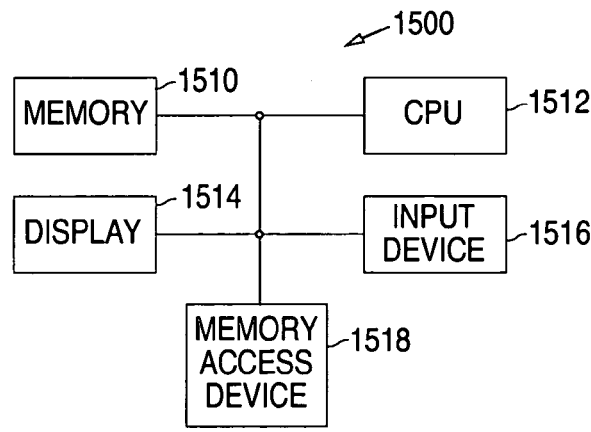
FIG. 15 is a block diagram illustrating a computer 1500 in accordance with the present invention.

Method 800 can be implemented in software that is executed on a computer. FIG. 15 shows a block diagram that illustrates a computer 1500 in accordance with the present invention. As shown in FIG. 15, computer 1500 includes a memory 1510 that stores software and data. The software includes an operating system and a set of program instructions.

As further shown in FIG. 15, computer 1500 also includes a central processing unit (CPU) 1512 that is connected to memory 1510. CPU 1512, which can be implemented as, for example, a 32-bit processor, operates on the data in response to the program instructions. Although only one processor is described, the present invention can be implemented with multiple processors in parallel to increase the capacity to process large amounts of data.

In addition, computer 1500 includes a display system 1514 that is connected to CPU 1512. Display system 1514 displays images to the user which are necessary for the user to interact with the program. Computer 1500 also includes a user-input device 1516, such as a keyboard and a pointing device, e.g., a mouse, which is connected to CPU 1512. The user operates input device 1516 to interact with the program.

Further, computer 1500 includes a memory access device 1518, such as a disk drive or a networking card, which is connected to memory 1510 and CPU 1512. Memory access device 1514 allows the processed data from memory 1510 or CPU 1512 to be transferred to an external medium, such as a disk or a networked computer. In addition, device 1518 allows the program instructions to be transferred to memory 1510 from the external medium.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of compensating a plurality of laser diodes, the method comprising the steps of:

detecting and storing a plurality of user-defined values, the plurality of user defined values including a range of temperatures, a plurality of temperatures in the range, a range of average optical power, and a range of extinction ratios;

determining a first maximum bias current and a first minimum bias current for each temperature in the range of temperatures using an average optical power from the range of average optical powers and an extinction ratio from the range of extinction ratios;

determining a second minimum bias current for each temperature that depends on whether the first minimum bias current at a temperature is less than a low current at the temperature;

defining the second minimum current to be equal to the low current when the first minimum current at a temperature is less than the low current at the temperature;

defining the second minimum current to be equal to the first minimum current when the first minimum current is equal to or greater than the low current; and determining a second maximum bias current for each temperature that depends on whether the value (IMAX1−IMH)/(IMIN2−ITH) is greater than or equal to the current extinction ratio, where IMAX1 represents the first maximum bias current, ITH represents a threshold current, and IMIN2 represents the second minimum bias current.

2. The method of claim 1 and further comprising the steps of:

defining the second maximum bias current as (2*ER*IAVG−(ER−1)*ITH)/(ERi+1) where IAVG= (IMAX1+IMIN2)/2 and where ER represents an extinction ratio when (IMAX1−ITH)/(IMIN2−ITH) ≧ER; and defining the second maximum bias current as ER* (IMIN2−ITH)+ITH where ER represents an extinction ratio when (IMAX1−ITH)/(IMIN2−ITH)<ER.

3. The method of claim 2 and further comprising the step of determining whether the second maximum bias current and the second minimum bias current produce an average optical power at each temperature that falls within a range of average optical powers.

4. The method of claim 3 and further comprising the steps of:

detecting a current temperature, and outputting values for the second maximum bias current, the second minimum bias current, and the threshold current that correspond with the current temperature;

identifying a to-be-compensated laser diode;

subtracting the threshold current from the second maximum bias current to form a first value;

multiplying the first value times a channel loss value of the to-be-compensated laser diode in the array to form a second value for the to-be-compensated laser diode in the array;

adding the threshold current to the second value to form a third value that can be output as a maximum bias current to the to-be-compensated laser diode; and subtracting the second minimum bias current from the third value to form a fourth value that can be output as a modulated bias current.

5. The method of claim 4 and further comprising the steps of:

adding a quantization factor to the third value to form a fifth value that can be output as the maximum bias current; and adding a quantization factor to the fourth value to form a sixth value that can be output as the modulated bias current.

6. The method of claim 1 and further comprising the step of determining a threshold current and a slope efficiency, for an array of laser diodes for each temperature in a range of temperatures.

7. A method of compensating a plurality of laser diodes, the method comprising the steps of:

detecting a current temperature, and outputting values for a maximum bias current, a minimum bias current, and the threshold current that correspond with the current temperature;

identifying a to-be-compensated laser diode;

subtracting the threshold current from the maximum bias current to form a first value;

multiplying the first value times a channel loss value of the to-be-compensated laser diode in the array to form a second value for the to-be-compensated laser diode in the array;

adding the threshold current to the second value to form a third value that can be output as a maximum bias current to the to-be-compensated laser diode; and subtracting the second minimum bias current from the third value to form a fourth value that can be output as a modulated bias current.

8. The method of claim 7 and further comprising the steps of:

adding a quantization factor to the third value to form a fifth value that can be output as the maximum bias current; and adding a quantization factor to the fourth value to form a sixth value that can be output as the modulated bias current.

9. A circuit that generates a maximum bias current and a modulated current based on temperature and channel conditions, the circuit including:

a thermistor that detects a current temperature;

a temperature compensation table for an array of diodes;

a channel compensation table that includes a plurality of entries for each laser diode in the array; and a first subtractor that subtracts a threshold current from the maximum bias current to form a first value.

10. The circuit of claim 9 and further comprising a multiplier that multiplies the first value times a channel loss value of a to-be-compensated laser diode in the array to form a second value for the to-be-compensated laser diode in the array.

11. The circuit of claim 10 and further comprising an adder that adds the threshold current to the second value to form a third value that can be output as the maximum bias current.

12. The circuit of claim 11 and further comprising a second subtractor that subtracts the minimum bias current from the third value to form a fourth value that can be output as the modulated bias current.

13. A method of compensating a plurality of laser diodes, the method comprising the steps of:

determining a threshold current at each of a plurality of temperatures within a range of temperatures for a diode;

determining a slope efficiency at each of the plurality of temperatures within the range of temperatures for the diode;

determining a first maximum bias current at each temperature within the range, the first maximum bias current at each temperature within the range being a function of the threshold current and slope efficiency such that the first maximum bias current at a temperature within the range is a function of the threshold current and the slope efficiency at the temperature; and determining a first minimum bias current at each temperature within the range, the first minimum bias current at each temperature within the range being a function of the first maximum bias current, the threshold current, and the slope efficiency such that the first minimum bias current at the temperature is a function of the first maximum bias current, the threshold current, and the slope efficiency at the temperature.

14. The method of claim 13 wherein the first maximum bias current at the temperature is defined by:

$$IMAX1=(2*PAVG*ER/SE+(ER+1)*ITH)/(ER+1)$$

where IMAX1 is the first maximum bias current at the temperature, PAVG is an average optical power, ER is an extinction ratio, SE is the slope efficiency at the temperature, and ITH is the threshold current at the temperature.

15. The method of claim 14 and further comprising the step of determining a first minimum bias current at each temperature within the range, the first minimum bias current at the temperature being defined by:

$$IMIN1=2*PAVG/SE+2*ITH-IMAX1$$

where IMIN1 is the first minimum bias current at the temperature.

16. The method of claim 15 and further comprising the steps of:

determining whether the first minimum bias current is less than a low current at the temperature, the low current being the sum of the threshold current at the temperature and an offset current at the temperature, and representing a lowest allowed bias current;

defining a second minimum bias current to be equal to the low current when the first minimum bias current at the temperature is less than the low current at the temperature; and defining the second minimum bias current to be equal to the first minimum bias current when the first minimum bias current is equal to or greater than the low current.

17. The method of claim 16 and further comprising the steps of:

determining a comparative value equal to (IMAX1−ITH)/(IMIN2−ITH) where IMAX1 represents the first maximum bias current, ITH represent the threshold current, and IMIN2 represents the second minimum bias current;

determining if the comparative value is greater than or equal to the extinction ratio;

when the comparative value is greater than or equal to the extinction ratio, determining a second maximum bias current by:

$$IMAX2=(2*ER*IAVG-(ER-1)*ITH)/(ER+1)$$

where IMAX2 represents the second maximum bias current, and IAVG=(IMAX1+IMIN2)/2; and when the comparative value is less than the extinction ratio, determining the second maximum bias current by:

$$IMAX2=ER*(IMIN2-ITH)+ITH.$$

18. The method of claim 17 and further comprising the steps of:

determining an output power of a channel by:

$$PMAX=SE*(IMAX2-ITH)*(1-M)$$

where PMAX is the output power and M is a channel loss factor;

determining a third maximum bias current at the temperature by:

$$IMAX3 = PMAX/(1-M)/SE + ITH.$$

where IMAX3 is the third maximum bias current; determining a calculated extinction ratio by:

$$ERC = (IMAX3 - ITH)/(IMIN2 - ITH).$$

where ERC is the calculated extinction ratio; and determining a third minimum bias current by:

$$IMIN3 = (IMAX3 - ITH)/ERC + ITH$$

where IMIN3 is the third minimum bias current.

* * * * *

UNITED STATES PATENT AND TRADEMARK OFFICE
CERTIFICATE OF CORRECTION

PATENT NO. : 7,054,343 B1  
APPLICATION NO. : 10/304356  
DATED : May 30, 2006  
INVENTOR(S) : Wu et al.

Page 1 of 1

It is certified that error appears in the above-identified patent and that said Letters Patent is hereby corrected as shown below:

Column 13,

Lines 1-13, delete entire table and replace with --

| Temp | Payg | ER | ITH | SE | ILOW | IMAX1 | IMIN1 | IMAX2 | IMIN2 |
|------|------|-----|-------|-------|-------|-------|-------|-------|-------|
| T0 (0°C.) | initial | New | Value | value | value | | | | |
| T1 (10°C.) | initial | New | Value | value | value | | | | |
| T2 (20°C.) | initial | New | Value | value | value | | | | |
| Tn (80°C.) | initial | Initial | Value | value | value | | | | |

--

Signed and Sealed this

Twenty-second Day of August, 2006

JON W. DUDAS  
*Director of the United States Patent and Trademark Office*